(12) United States Patent
Ding et al.

(10) Patent No.: US 9,831,139 B2
(45) Date of Patent: Nov. 28, 2017

(54) TEST STRUCTURE AND METHOD OF MANUFACTURING STRUCTURE INCLUDING THE SAME

(71) Applicant: Samsung Electronics Co., Ltd., Suwon-si (KR)

(72) Inventors: Shaofeng Ding, Suwon-si (KR); Junjung Kim, Suwon-si (KR); Jeong HOON Ahn, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/997,823

(22) Filed: Jan. 18, 2016

(65) Prior Publication Data

US 2017/0207137 A1 Jul. 20, 2017

(51) Int. Cl.
*H01L 21/66* (2006.01)
*G01R 31/28* (2006.01)
*G01R 31/26* (2014.01)
*H01L 23/544* (2006.01)
*H01L 21/78* (2006.01)

(52) U.S. Cl.
CPC .......... *H01L 22/32* (2013.01); *G01R 31/2644* (2013.01); *G01R 31/2884* (2013.01); *H01L 21/78* (2013.01); *H01L 23/544* (2013.01); *H01L 2223/5446* (2013.01)

(58) Field of Classification Search
CPC ......... H01L 22/22; H01L 22/30; H01L 22/34; G01R 31/2884; G01R 31/2644; G01R 31/2646
See application file for complete search history.

(56) References Cited

U.S. PATENT DOCUMENTS

| 6,362,638 | B1 | 3/2002 | Ashton et al. |
| 6,881,597 | B2 * | 4/2005 | Asayama ................ H01L 22/34 438/18 |
| 7,046,026 | B2 | 5/2006 | Chao et al. |
| 7,105,856 | B1 | 9/2006 | Wu et al. |
| 8,445,295 | B2 | 5/2013 | Shibuya et al. |
| 2011/0284843 | A1 * | 11/2011 | Chen ....................... H01L 22/34 257/48 |

FOREIGN PATENT DOCUMENTS

| KR | 10-0536803 | 12/2005 |
| KR | 10-0591153 | 6/2006 |
| KR | 10-0638042 | 10/2006 |
| KR | 10-0856319 | 9/2008 |
| KR | 10-2010-0079217 | 7/2010 |
| KR | 10-1167199 | 7/2012 |

* cited by examiner

*Primary Examiner* — Thanhha Pham
(74) *Attorney, Agent, or Firm* — H.C. Park & Associates, PLC (57) ABSTRACT

A test structure for manufacturing a semiconductor device includes a test element, a first pad connected to the test element, and a second pad connected to the test element. A first wire is connected to the test element, and the first wire and the test element are part of a first layer disposed on a semiconductor substrate. A second wire is connected to the first wire, and is part of a second layer disposed on the semiconductor substrate, and the second layer is different from the first layer.

20 Claims, 6 Drawing Sheets

TEST STRUCTURE AND METHOD OF MANUFACTURING STRUCTURE INCLUDING THE SAME

BACKGROUND

Field

Exemplary embodiments relate to test structures, and, more particularly, to a test structure and a method of manufacturing a structure including the same.

Discussion

Manufacturing integrated circuit (IC) chips (or devices) may involve performing various thin-film processes on a semiconductor substrate. IC chips formed on a semiconductor substrate may be spaced apart from one another by a distance spanning a scribe region (or line) used to dice the semiconductor substrate into individual IC chips. Although semiconductor elements constituting an IC chip may not be formed in the scribe region, the scribe region may include pads for process monitoring.

For instance, during semiconductor manufacturing, IC chips may be tested as each thin-film process is performed on the IC chips to increase product reliability. A test element that corresponds to a semiconductor element may be simultaneously formed in a scribe region when forming the semiconductor element in an IC chip region. Since manufacturing conditions of a test element may be substantially the same as those of a corresponding semiconductor element, electrical characteristics of the semiconductor element may be effectively tested by testing the simultaneously formed test element. One or more test elements may be grouped, which may be referred to as a test structure or a test element group (TEG).

Designing a high performance IC chip may include increasing the number of semiconductor elements formed on the IC chip. Thus, increasing product reliability of high performance IC chips may involve testing more elements, which may require more space in a scribe region. On the other hand, designing a high performance IC chip may also require scaling down a footprint of the IC chip on a single semiconductor substrate. This may involve reducing the size of a scribe region. Accordingly, it is difficult to design an effective test structure in a limited amount of space in a scribe line.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a test structure having a Kelvin structure that may test electrical properties of semiconductor elements and a method of manufacturing a semiconductor substrate including the same.

Additional aspects will be set forth in the detailed description which follows, and, in part, will be apparent from the disclosure, or may be learned by practice of the inventive concept.

According to one or more exemplary embodiments, a test structure for manufacturing a semiconductor device includes a test element, a first pad connected to the test element, and a second pad connected to the test element. A first wire is connected to the test element, and the first wire and the test element are part of a first layer disposed on a semiconductor substrate. A second wire is connected to the first wire and is part of a second layer disposed on the semiconductor substrate. The second layer is different from the first layer.

According to one or more exemplary embodiments, a semiconductor substrate includes a first semiconductor device region, a second semiconductor device region, and a scribe region disposed between the first semiconductor device region and the second semiconductor device region. The scribe region includes a test structure. The test structure includes: a first test element, a first pad connected to the first test element, a second pad connected to the first element, a first wire connected to the first test element, a second test element, and a second wire connected to the second test element and the first wire. The first wire and the first test element are part of a first layer disposed on the semiconductor substrate. The second wire and the second test element are part of a second layer disposed on the semiconductor substrate and the second layer is different from the first layer. The first wire is connected to the second wire through a via.

According to one or more exemplary embodiments, a method of manufacturing semiconductor devices includes forming semiconductor devices adjacent to one another, and forming a test structure between the semiconductor devices. The test structure includes: a test element; a first pad connected to the test element; a second pad connected to the test element; a first wire connected to the test element, the first wire and the test element being disposed on a first layer; a second wire connected to the first wire and disposed on a second layer different from the first layer; a third wire connected to the test element and disposed on the first layer; and a fourth wire connected to the third wire and disposed on a third layer different from the first layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
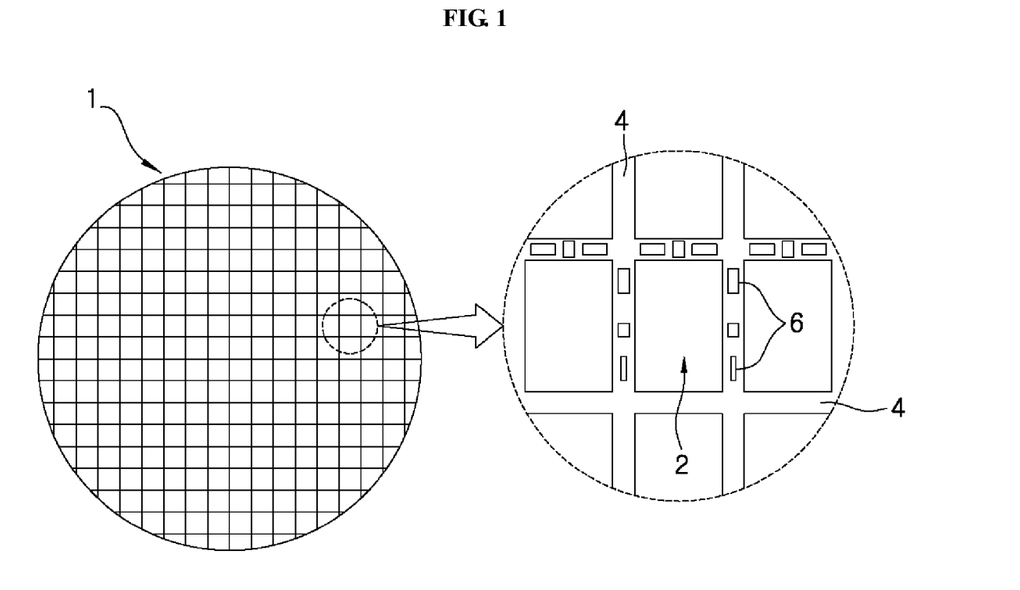
FIG. 1 is a schematic view of a semiconductor substrate including test structures, according to one or more exemplary embodiments.

FIG. 1 is a schematic view of a semiconductor substrate including test structures, according to one or more exemplary embodiments.

Referring to FIG. 1, semiconductor substrate 1 may be a wafer for manufacturing semiconductor chips (or devices). Semiconductor substrate 1 includes semiconductor chip (or device) regions 2, which may be spaced apart from each other by scribe regions 4. Semiconductor substrate 1 may be diced along scribe region 4 (as part of fabricating semiconductor chips on semiconductor chip regions 2) to separate semiconductor chips from semiconductor substrate 1. Test structures 6 may be formed in scribe region 4 to test electrical properties of one or more test elements corresponding to a semiconductor element forming at least a portion of a related semiconductor chip. Test structure 6 may include one or more test elements.

Figure 2A:
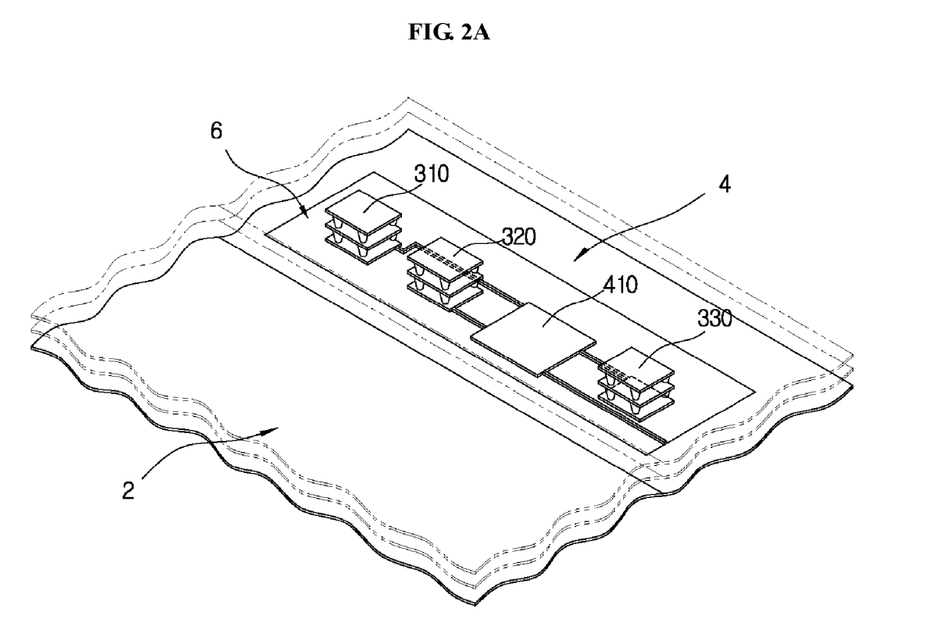
FIG. 2A is a schematic view of test elements of a test structure, according to one or more exemplary embodiments.
Figure 2B:
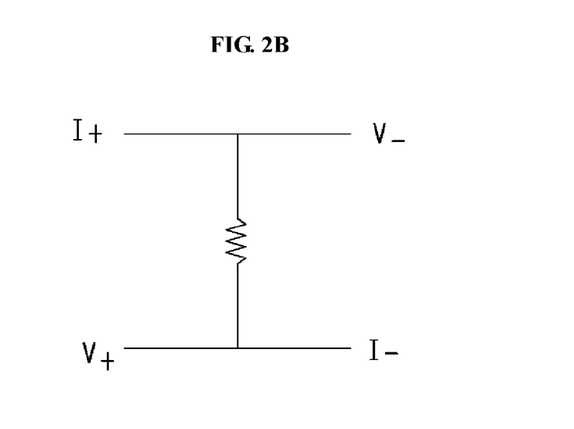
FIG. 2B is a circuit diagram of a conventional Kelvin resistance test structure.

FIG. 2A is a schematic view of test elements of a test structure, according to one or more exemplary embodiments. FIG. 2B is a circuit diagram of a conventional Kelvin resistance test structure.

A semiconductor chip formed in semiconductor chip region 2 may be formed through various processes, including a thin-film process that may be associated with depositing various layers, wires, etc., thereon. To increase reliability of a semiconductor chip, each process (or a result thereof) performed on semiconductor substrate 1 may be tested. For instance, electrical properties of a semiconductor element, such as a layer, a wire, and a via, disposed in semiconductor chip region 2 may be tested by simultaneously disposing a test element in scribe region 4 and testing the test element. Test elements may be grouped into a test structure.

Referring to FIG. 2A, test structure 6 may be formed in scribe region 4. Test structure 6 may include test element 410 and pads 310, 320, and 330 respectively connected to test element 410. Semiconductor elements forming at least a portion of a semiconductor chip may be formed in semiconductor chip region 2. A test element may correspond to one of the semiconductor elements. For instance, test element 410 may be formed according to the same manufacturing conditions as a bottom semiconductor element disposed in a semiconductor chip region 2, such as the material used, structural configuration, processing techniques, and the like. In this manner, test element 410 may have substantially the same electrical characteristics as those of the bottom semiconductor element.

Pads 310, 320, and 330 connected to test element 410 may include multiple layers. For descriptive convenience, pads 310, 320, and 330 will be described as including three layers. Each layer may be conductive and include, for example, metal, such as, at least one of copper (Cu), tungsten (W), aluminum (Al), and an alloy thereof, but not limited thereto. The three layers may be disposed to substantially face one another in a thickness direction and insulated from one another by an insulating layer (not shown) disposed therebetween. For example, the insulating layer may include a dielectric layer, such as silicon oxide, or a material having a dielectric constant lower that than of the silicon oxide, such as silicon fluoride oxide (SiOF), silicon oxycarbide (SiOC), silicon boron nitride (SiBN), and silicon boron carbon nitride (SiBCN).

The three layers may be connected to one another through at least one or more vias. The vias may be filled with conductive material, and, as such, the three layers may have substantially the same electrical characteristics with each other. For example, the three layers may be formed by, for example, a damascene process, a metal etching process, and/or the like. Although not illustrated, pads 310, 320, and 330 may be connected to probes of a probe card used to respectively contact the pads. The probes may measure electrical characteristics of connected pads 310, 320, and 330. In this manner, electrical characteristics of the bottom semiconductor element may be measured by measuring those of test element 410 through pads 310, 320, and 330.

Referring to FIG. 2B, in a conventional Kelvin resistance test structure, a test element corresponding to a semiconductor element may be connected to four pads to test the resistance of the semiconductor element. Although not illustrated, a probe card may apply current through two of the pads connected to two ends of the test element. The voltage drop of the test element resulting from the current flow may be measured via the remaining pads connected to two ends of the test element. In this manner, the resistance of the test element may be calculated according to Ohm's law based on the measured voltage drop and the current. As such, a conventional Kelvin resistance test structure may utilize four pads, two of which are configured to apply current to a test element, and the other two are configured to measure the potential difference (or voltage drop) between two ends of the test element.

Figure 3:
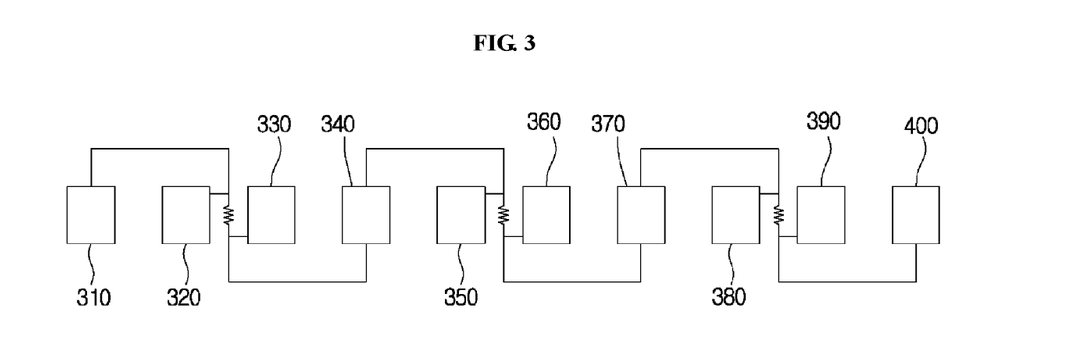
FIG. 3 is circuit diagram of a conventional Kelvin resistance test structure.

FIG. 3 is circuit diagram of a conventional Kelvin resistance test structure.

Referring to FIG. 3, ten pads 310, 320, 330, 340, 350, 360, 370, 380, 390, and 400 may be connected to three test elements to measure the resistance thereof. The three test elements may respectively correspond to three semiconductor elements forming at least a portion of a semiconductor chip. As will become more apparent below, 3*n+1 pads may be used to measure the resistance of n test elements (where n is a positive integer). Structural aspects between test elements and pads will be further described in association with FIGS. 4 and 5.

Figure 4:
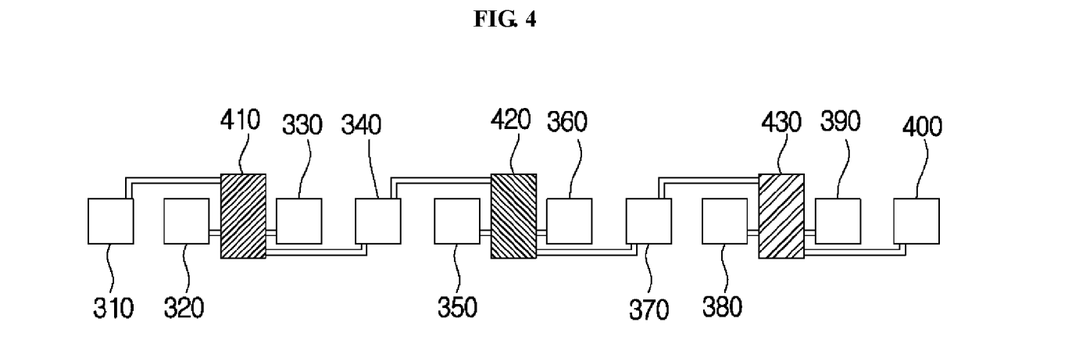
FIG. 4 is a plan view of the conventional Kelvin resistance test structure of FIG. 3.
Figure 5:
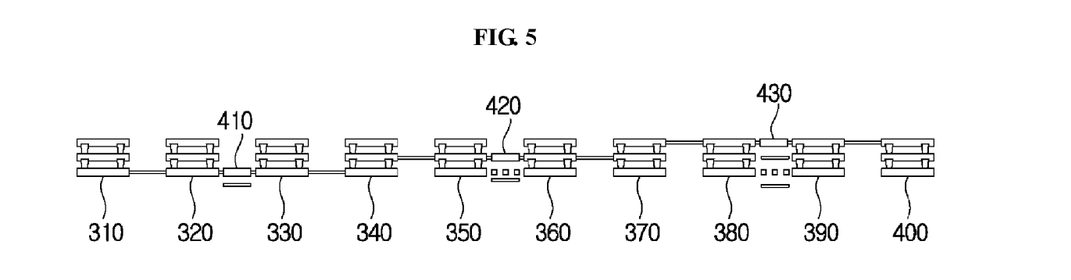
FIG. 5 is a cross-sectional view of the conventional Kelvin resistance test structure of FIG. 4.

FIG. 4 is a plan view of the conventional Kelvin resistance test structure of FIG. 3, whereas FIG. 5 is a cross-sectional view of the conventional Kelvin resistance test structure of FIG. 4.

Referring to FIG. 4, first, second and third test elements 410, 420, and 430 are respectively connected to four pads to measure the resistance thereof. In particular, first test element 410 is connected to first, second, third, and fourth pads 310, 320, 330, and 340. Second test element is connected to fourth, fifth, sixth, and seventh pads 340, 350, 360, and 370. Third test element is connected to seventh, eighth, ninth, and tenth pads 370, 380, 390, and 400. In this manner, fourth pad 340 is commonly used in measuring the resistance of first and second test elements 410 and 420, and seventh pad 370 is commonly used in measuring the resistance of second and third test elements 420 and 430.

Each pad 310, 320, 330, 340, 350, 360, 370, 380, 390, and 400 may include multiple layers. For descriptive convenience each pad will be described as including three layers. Referring to FIG. 5, each pad 310, 320, 330, 340, 350, 360, 370, 380, 390, and 400 may include three layers. The three layers may be connected by at least one or more vias. The vias may be filled with conductive material, and, as such, the three layers may have substantially the same electrical characteristics as one another. Among the three layers, first test element 410 may be disposed on a bottom layer, second test element 420 may be disposed on a middle layer, and third test element 430 may be disposed on a top layer.

First, second, third, and fourth pads 310, 320, 330, and 340 may be electrically connected to first test element 410 through the bottom layer, respectively, to measure the resistance of first test element 410. A current may be input to first test element 410 via first pad 310 and output via fourth pad 340. The voltage drop between two ends of first test element 410 may be measured via second and third pads 320 and 330.

Fourth, fifth, sixth, and seventh pads 340, 350, 360, and 370 may be electrically connected to second test element 420 through the middle layer, respectively, to measure the resistance of second test element 420. A current may be input to second test element 420 via fourth pad 340 and output via seventh pad 370. The voltage drop between two ends of second test element 420 may be measured via fifth and sixth pads 350 and 360.

Seventh, eighth, ninth, and tenth pads 370, 380, 390, and 400 may be electrically connected to third test element 430 through the top layer, respectively, to measure the resistance of third test element 430. A current may be input to third test element 430 via seventh pad 370 and output via tenth pad 400. The voltage drop between two ends of third test element 430 may be measured via eighth and ninth pads 380 and 390.

Fourth pad 340 and seventh pad 370 may be commonly used in the above-noted measurements. Each of fourth and seventh pads 340 and 370 may be connected to corresponding test elements via different layers. For instance, one end of fourth pad 340 may be connected to first test element 410 via the bottom layer, and may be configured to output the current used to measure the resistance of first test element 410. The other end of fourth pad 340 may be connected to second test element 420 via the middle layer, and may be configured to receive an input current for measuring the resistance of second test element 420. One end of seventh pad 370 may be connected to second test element 420 via the middle layer, and may be configured to output the current used to measure the resistance of second test element 420. The other end of the seventh pad 370 may be connected to third test element 430 via the top layer, and may be configured to receive an input current for measuring the resistance of third test element 430.

According to FIGS. 3, 4, and 5, a conventional Kelvin resistance test structure utilizes 3*n+1 pads to measure the resistance of n test elements (where n is a positive integer). For example, 31 pads may be utilized to test the resistance of a semiconductor chip including 10 layers. However, with the advancement of semiconductor chip design, more layers may be integrated into a semiconductor chip to provide, for instance, higher performance. The footprint, however, of the semiconductor chip may be maintained or scaled down. Accordingly, although the increased number of pads for measuring the resistance of additional layers may increase product reliability, additional space required for the additional pads may lower a degree of integration.

According to one or more exemplary embodiments, a Kelvin resistance test structure may reduce the number of pads for measuring electrical properties of a test element. In this manner, the resistance of more test elements corresponding to semiconductor elements may be measured in a scribe region.

Figure 6:
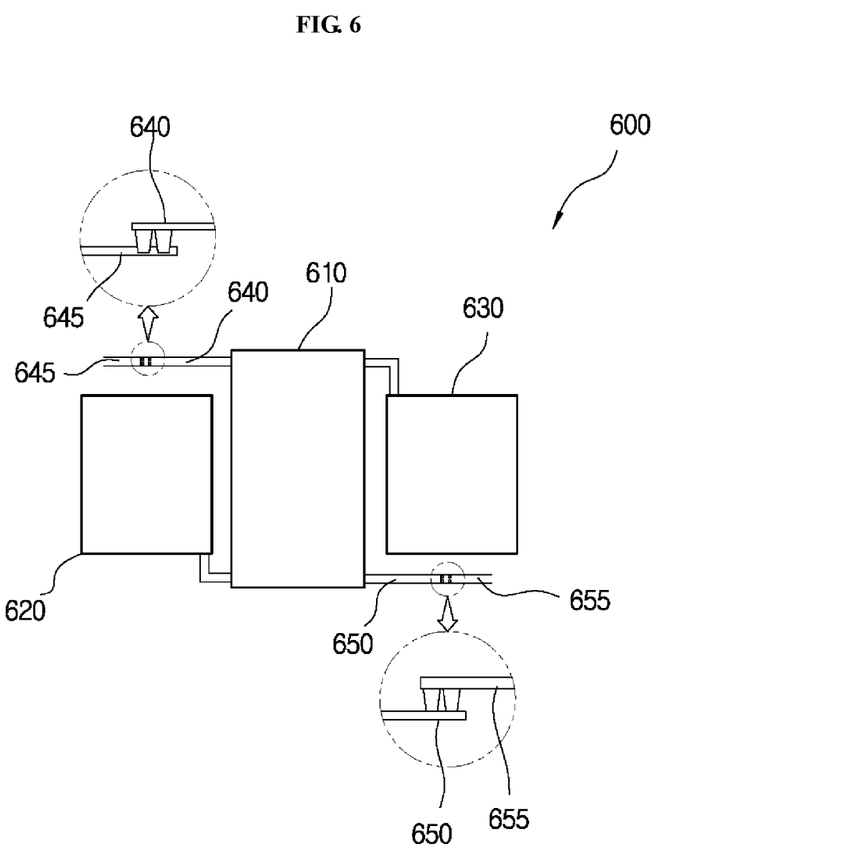
FIG. 6 is a plan view of a Kelvin resistance test structure, according to one or more exemplary embodiments.

FIG. 6 is a plan view of a Kelvin resistance test structure, according to one or more exemplary embodiments.

Referring to FIG. 6, test structure 600 for measuring electrical properties of test element 610, such as the resistance, temperature, etc., may include test element 610, first pad 620, and second pad 630 electrically connected to test element 610. Test structure 600 may further include first wire 640 electrically connected to third wire 645 disposed on (or being part of) a first layer different from a layer on which test element 610 is disposed, and second wire 650 electrically connected to fourth wire 655 disposed on a (or being part of) second layer different from the layer on which test element 610 is disposed. First, second, third, and fourth wires 640, 650, 645, and 655 may be conductive and include, for example, metal, such as, at least one of copper (Cu), tungsten (W), aluminum (Al), and an alloy thereof, but not limited thereto.

First wire 640, second wire 650, and test element 610 may be disposed on (or being part of) the same layer as one another. First and second pads 620 and 630 may include multiple layers. Each pad, however, will be described as including three layers for descriptive convenience. According to one or more exemplary embodiments, third wire 645 and fourth wire 655 may be disposed on the same layer that is different from the layer on which test element 610 is disposed. It is further noted that, although FIG. 6 illustrates that third wire 645 is disposed below first wire 640 and fourth wire 655 is disposed above second wire 650, relative configurational arrangements of first, second, third, and fourth wires 640, 650, 645, and 655 may be varied. For instance, third wire 645 may be disposed above first wire 640, and fourth wire 655 may be disposed below second wire 650. As another example, third wire 645 and fourth wire 655 may be disposed on the same layer different from the layer on which test element 610 is disposed.

Four parts may be connected to test element 610 to measure the current applied to the test element 610, and the potential difference between two ends of test element 610. In this manner, the electrical properties of test element 610 (for example, the resistance) may be calculated using Ohm's law based on the measured current and voltage drop. First and second pads 620 and 630 may be connected to test element 610 to measure the voltage drop between two ends of test element 610. A current may be input to test element 610 via first and third wires 640 and 645, and output via second and fourth wires 650 and 655. Alternatively (or additionally), a current may be input to test element 610 via second and fourth wires 650 and 655, and output via first and third wires 640 and 645. In this manner, the resistance of test element 610 may be calculated based on the measured current and voltage drop.

As used herein, test element 610 may be formed according to the same manufacturing conditions as a semiconductor element forming an IC chip, such as the material used, structural configuration, processing techniques, and the like. A semiconductor element may be any constituting element forming at least a portion of an IC chip, such as a layer, wire, via, etc. A semiconductor element (and test element 610) may include various materials, such as a conductive material (metal, graphene, carbon nanotube, conductive polymer, etc.), a semiconducting material, and a non-conductive material, etc.

First wire 640 disposed on the same layer as test element 610 and third wire 645 disposed on the first layer may be connected to each other by one or more vias. Second wire 650 disposed on the same layer as test element 610 and fourth wire 655 disposed on the second layer may be connected to each other by one or more vias. Vias may be filled with conductive material to electrically connect wires disposed on different layers.

Figure 7:
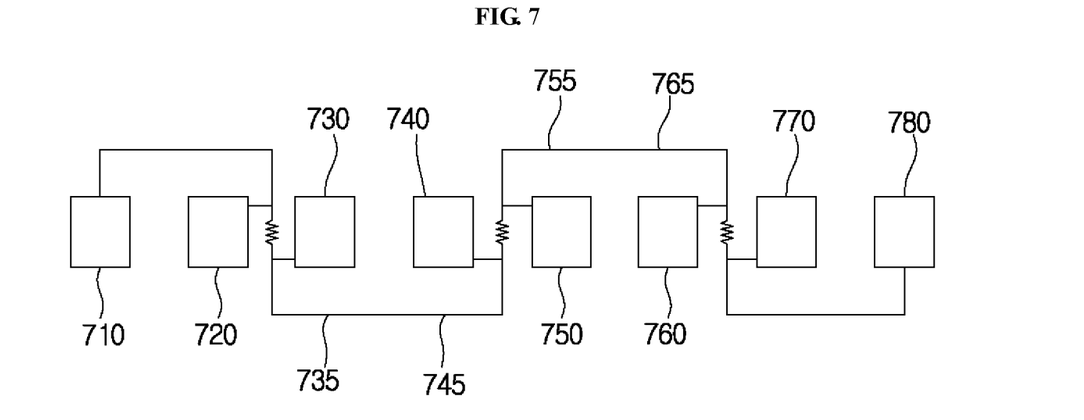
FIG. 7 is a circuit diagram of a Kelvin resistance test structure, according to one or more exemplary embodiments.

FIG. 7 is a circuit diagram of a Kelvin resistance test structure, according to one or more exemplary embodiments.

Referring to FIG. 7, eight pads 710, 720, 730, 740, 750, 760, 770, and 780 are connected to measure the resistance of three test elements. As will become more apparent below, 2*n+2 pads may be utilized to measure the resistance of n test elements (where n is a positive integer). Structural aspects between test elements and pads will be further described in association with FIGS. 8 and 9.

Figure 8:
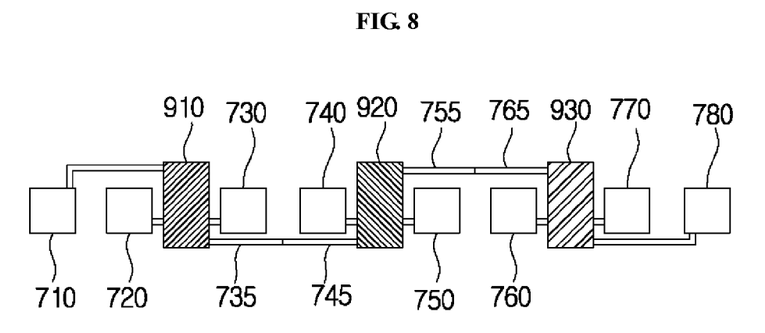
FIG. 8 is a plan view of the Kelvin resistance test structure of FIG. 7, according to one or more exemplary embodiments.
Figure 9:
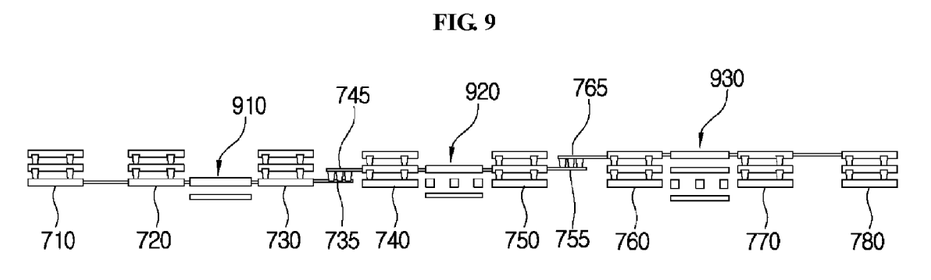
FIG. 9 is a cross-sectional view of the Kelvin resistance test structure of FIG. 8, according to one or more exemplary embodiments.

FIG. 8 is a plan view of the Kelvin resistance test structure of FIG. 7, according to one or more exemplary embodiments. FIG. 9 is a cross-sectional view of the Kelvin resistance test structure of FIG. 8, according to one or more exemplary embodiments.

Referring to FIG. 8, first, second, and third test elements 910, 920, and 930 are respectively connected to two pads to measure the voltage drop between two ends of each of first, second, and third test elements 910, 920, and 930. For instance, first test element 910 is connected to second and third pads 720 and 730. Second test element 920 is connected to fourth and fifth pads 740 and 750. Third test element 930 is connected to sixth and seventh pads 760 and 770. Moreover, first test element 910 is connected to first pad 710 for inflow of a current, and third test element 930 is connected to eighth pad 780 for outflow of the current therefrom. First and second test elements 910 and 920 are connected to each other via wires disposed on different layers, and second and third test elements 920 and 930 are connected to each other via wires disposed on different layers.

Referring to FIG. 9, each pad 710, 720, 730, 740, 750, 760, 770, and 780 may include multiple layers. For descriptive convenience, each pad 710, 720, 730, 740, 750, 760, 770, and 780 will be described as including three layers. The three layers may be connected by at least one or more vias. The vias may be filled with conductive material, and, as such, the three layers may have substantially the same electrical characteristics with each other. Among the three layers, first test element 910 may be disposed on a bottom layer, second test element 920 may be disposed on a middle layer, and third test element 930 may be disposed on a top layer.

A current may be applied to first test element 910 via first pad 710. The current may flow from first test element 910 to second test element 920 via first wire 735 disposed on the bottom layer and second wire 745 disposed on the middle layer. The current may flow from second test element 920 to third test element 930 via third wire 755 disposed on the middle layer and fourth wire 765 disposed on the top layer. The current may be output via eighth pad 780. First and second wires 735 and 745 may be connected to each other through at least one or more vias, and third and fourth wires 755 and 765 may be connected to each other through at least one or more vias, which may be filled with conductive material. First, second, and third wires 735, 745, and 755 may not be exposed to an upper surface of a test structure.

In this manner, the current from first pad 710 to eighth pad 780 may generate a potential difference between the two ends of each of first, second, and third test elements 910, 920, and 930. The voltage drop between the two ends of each of first, second, and third test elements 910, 920, and 930 may be respectively measured by second and third pads 720 and 730, fourth and fifth pads 740 and 750, and sixth and seventh pads 760 and 770. In this manner, the resistance of each of first, second, and third test elements 910, 920, and 930 may be calculated based on the measured voltage and current. It is noted that, however, relative configurational arrangements of first, second, third, and fourth wires 735, 745, 755, and 765 may be varied. For example, first and fourth wires 735 and 765 may be disposed on the same layer different from the layer on which second and third wires 745 and 755 are disposed.

Figure 10:
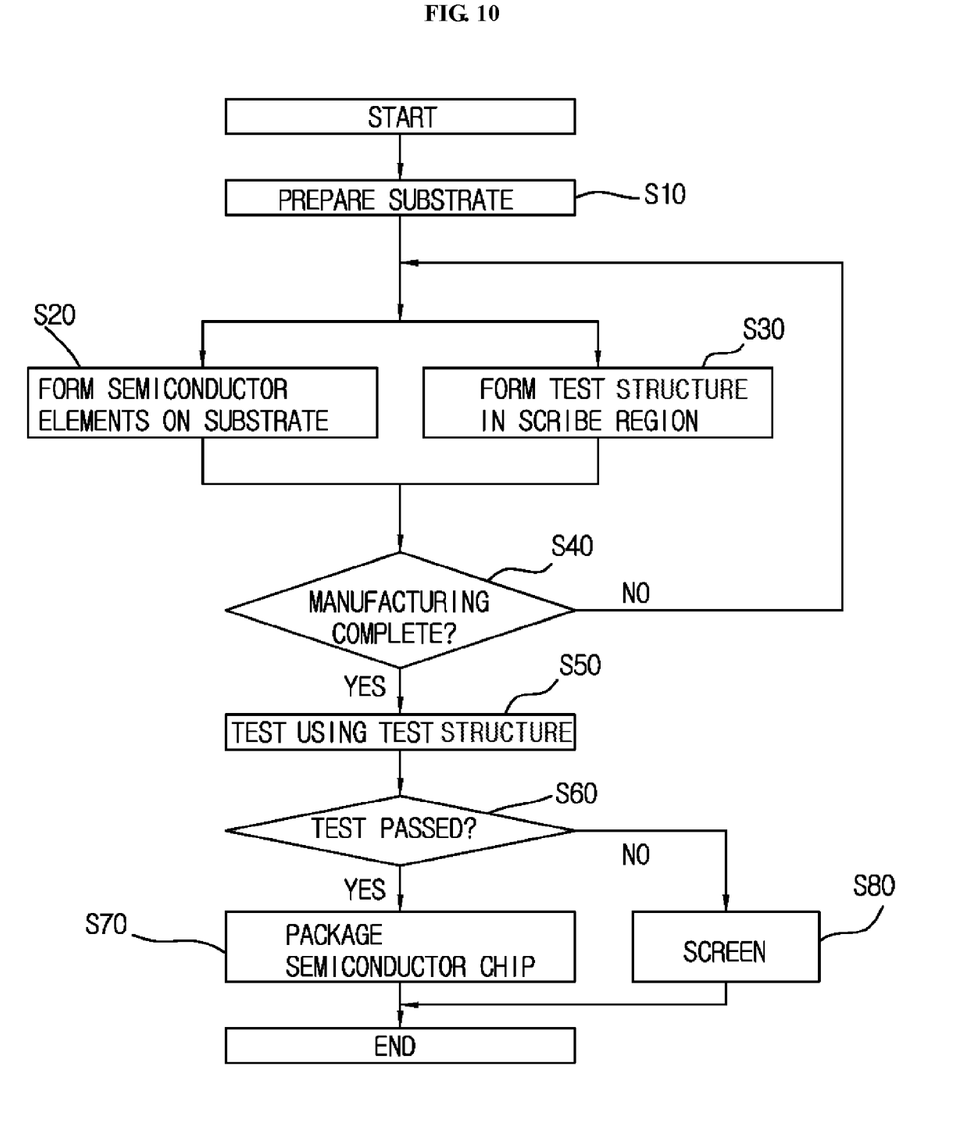
FIG. 10 is a flowchart of a process for manufacturing a semiconductor substrate including a test structure, according to one or more exemplary embodiments.

FIG. 10 is a flowchart of a process for manufacturing a semiconductor substrate including a test structure, according to one or more exemplary embodiments.

Referring to FIG. 10, in step S10, a semiconductor substrate including semiconductor chip regions and at least one scribe region is prepared. As previously described, the scribe region is to include test structures. At step S20, semiconductor elements are formed in the semiconductor chip regions as part of fabricating the semiconductor chips. The semiconductor chip regions may be spaced apart from each other by the scribe regions. A test structure including at least one test element corresponding to a semiconductor element may be simultaneously formed in the scribe region, per step S30. The test structure may include a Kelvin structure for measuring electrical characteristics of the test elements, such as the resistance, temperature, etc., of the test elements.

In step S40, it is determined whether formation of the semiconductor elements is complete. If fabrication is not complete, the process continues to S20 and S30 to continue formation of the semiconductor elements and test structure. If fabrication is complete, the test structure is utilized to test the test elements, per step S50. Test results of each test element for each semiconductor chip region may be stored in a database, which may be fed back to the production line. At step S60, test results stored in the database are retrieved to screen semiconductor chips corresponding to test structures that passed/failed testing procedures. At step S70, the semiconductor chips corresponding to test structures that passed the tests proceed to packaging. Packaging process may include dicing the semiconductor substrate along the scribe region to separate the semiconductor chips. The semiconductor chips corresponding to test structures that did not pass the tests may proceed for further evaluation, rework, such as laser trimming, etc., or may be discarded, per step S80. It is noted that dicing the semiconductor substrate may be performed after performing the rework on the semiconductor chips corresponding to test structures that did not pass the tests. It is further noted that at least in step S60, semiconductor chips may be tested using various methods, and test results thereof may be utilized as part of manufacturing process. Detailed description and processes of testing semiconductor chips will be omitted to avoid obscuring exemplary embodiments described herein.

According to one or more exemplary embodiments, a test structure having a Kelvin structure may measure the resistance of n test elements utilizing 2*n+2 pads (or a ratio between a number of pads and a number of test elements is 2*n+2:n). In this manner, the number of pads used to measure the resistance of each test element may be reduced by n−1, and, as such, enabling testing of more test elements in a scribe region.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A test structure for manufacturing a semiconductor device, comprising:
    a test element;
    a first pad connected to the test element;
    a second pad connected to the test element;
    a first wire connected to the test element, the first wire and the test element being part of a first layer disposed on a semiconductor substrate; and
    a second wire connected to the first wire through a first via, the second wire being part of a second layer disposed on the semiconductor substrate,
    wherein:
      the second layer is different from the first layer; and
      the first via is, in a plan view, spaced apart from each pad of the test structure.

2. The test structure of claim 1, further comprising:
    a third wire connected to the test element, the third wire being part of the first layer; and
    a fourth wire connected to the third wire, the fourth wire being part of a third layer disposed on the semiconductor substrate, the third layer being different from the first layer.

3. The test structure of claim 2, wherein the second layer is different from the third layer.

4. The test structure of claim 2, further comprising:
    a third pad connected to the second wire, the third pad being configured to receive an input current to the test element; and a fourth pad connected to the fourth wire, the fourth pad being configured to output the current from the test element.

5. The test structure of claim 4, wherein:
the third pad, the second wire, and the first wire are configured to transmit the current to the test element; and
the third wire, the fourth wire, and the fourth pad are configured to output the current from the test element.

6. The test structure of claim 2, wherein the third wire is connected to the fourth wire through a second via.

7. The test structure of claim 1, wherein the test structure is disposed in a scribe region.

8. The test structure of claim 7, wherein:
the scribe region is disposed between adjacent at least partially formed semiconductor devices; and
the semiconductor device and the test element comprise a layer formed according to the same manufacturing conditions.

9. The test structure of claim 8, wherein the layer comprises metal.

10. The test structure of claim 2, wherein the test structure defines a Kelvin structure.

11. The test structure of claim 10, wherein:
a ratio between a number of pads and a number of test elements is 2*n+2:n; and
n is a positive integer.

12. A semiconductor substrate, comprising:
a first semiconductor device region;
a second semiconductor device region; and
a scribe region disposed between the first semiconductor device region and the second semiconductor device region, the scribe region comprising a test structure,
wherein the test structure comprises:
a first test element;
a first pad connected to the first test element;
a second pad connected to the first test element;
a first wire connected to the first test element, the first wire and the first test element being part of a first layer disposed on the semiconductor substrate;
a second test element; and
a second wire connected to the second test element and the first wire, the second wire and the second test element being part of a second layer disposed on the semiconductor substrate, the second layer being different from the first layer,
wherein the first wire is connected to the second wire through a via.

13. The semiconductor substrate of claim 12, wherein:
the first test element and the second test element are respectively one of n test elements, n being a positive integer; and
a ratio between a number of pads and a number of test elements is 2*n+2:n.

14. A test structure for manufacturing a semiconductor device, comprising:
a test element;
a first pad connected to the test element;
a second pad connected to the test element;
a first wire connected to the test element, the first wire and the test element being part of a first layer disposed on a semiconductor substrate; and
a second wire connected to the first wire, the second wire being part of a second layer disposed on the semiconductor substrate, the second layer being different from the first layer,
wherein the test structure defines a Kelvin structure.

15. The test structure of claim 14, further comprising:
a third wire connected to the test element, the third wire being part of the first layer; and
a fourth wire connected to the third wire, the fourth wire being part of a third layer disposed on the semiconductor substrate, the third layer being different from the first layer.

16. The test structure of claim 15, wherein the second layer is different from the third layer.

17. The test structure of claim 15, further comprising:
a third pad connected to the second wire, the third pad being configured to receive an input current to the test element; and
a fourth pad connected to the fourth wire, the fourth pad being configured to output the current from the test element.

18. The test structure of claim 15, wherein:
the first wire is connected to the second wire through a via; and
the third wire is connected to the fourth wire through a via.

19. The test structure of claim 14, wherein:
a ratio between a number of pads and a number of test elements is 2*n+2:n; and
n is a positive integer.

20. The test structure of claim 14, wherein the test structure is disposed in a scribe region.

* * * * *